(12) United States Patent
Ishio et al.

(10) Patent No.: US 6,495,389 B2
(45) Date of Patent: Dec. 17, 2002

(54) METHOD FOR MANUFACTURING SEMICONDUCTOR PRESSURE SENSOR HAVING REFERENCE PRESSURE CHAMBER

(75) Inventors: Seiichiro Ishio, Kariya (JP); Inao Toyoda, Okazaki (JP); Yasutoshi Suzuki, Okazaki (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/924,559

(22) Filed: Aug. 9, 2001

(65) Prior Publication Data

US 2002/0028529 A1 Mar. 7, 2002

(30) Foreign Application Priority Data

Sep. 5, 2000 (JP) .......................... 2000-269079
Jan. 11, 2001 (JP) .......................... 2001-004028

(51) Int. Cl.⁷ ............................................ H01L 21/00
(52) U.S. Cl. .............................. 438/53; 438/48; 438/14; 438/51; 438/54
(58) Field of Search ................... 257/252, 254, 257/414, 417; 438/14, 53, 48–54

(56) References Cited

U.S. PATENT DOCUMENTS

| | | | | |
|---|---|---|---|---|
| 5,242,863 A | * | 9/1993 | Xiang-Zheng et al. | 438/53 |
| 5,437,189 A | * | 8/1995 | Brown et al. | 73/721 |
| 5,564,434 A | * | 10/1996 | Halperin et al. | 128/48 |
| 5,740,594 A | * | 4/1998 | Lukasiewicz et al. | 29/25.41 |
| 6,311,561 B1 | * | 11/2001 | Bang et al. | 73/708 |

FOREIGN PATENT DOCUMENTS

| | | |
|---|---|---|
| JP | A-6-18345 | 1/1994 |
| JP | A-8-236788 | 9/1996 |
| JP | A-9-210822 | 8/1997 |
| JP | A-11-298009 | 10/1999 |
| JP | A-2000-58780 | 2/2000 |

OTHER PUBLICATIONS

Sato et al., "A new substrate engineering using silicon surface migration", *Preliminary Report No. 2*, the 47th Applied Physics Association, Mar. 28–31, 2000, pp. 888–889. (Discussed on p. 13 of the spec.).

* cited by examiner

*Primary Examiner*—David Nelms
*Assistant Examiner*—Thao Le
(74) *Attorney, Agent, or Firm*—Law Offices of David G. Posz

(57) ABSTRACT

In a method for manufacturing a semiconductor pressure sensor, after a reference pressure chamber is formed inside a semiconductor substrate and a diaphragm is formed from a part of the semiconductor substrate, a heat treatment is performed to form an insulation film, an element, or the like on the semiconductor substrate. At that time, a heat treatment temperature is controlled to be lower than $(-430P_0+1430)°$ C. where $P_0$ is an internal pressure (atm) of the reference pressure chamber at a room temperature. Accordingly, crystal defects can be prevented from being produced in the diaphragm.

7 Claims, 4 Drawing Sheets

METHOD FOR MANUFACTURING SEMICONDUCTOR PRESSURE SENSOR HAVING REFERENCE PRESSURE CHAMBER

CROSS REFERENCE TO RELATED APPLICATIONS

This application is based upon and claims the benefit of Japanese Patent Applications No. 2000-269079 filed on Sep. 5, 2000, No. 2001-4028 filed on Jan. 11, 2001, the contents of which are incorporated herein by reference.

BACKGROUND OF THE INVENTION

1. Field of the Invention

This invention relates to a method for manufacturing a semiconductor pressure sensor having a closed cavity formed in a semiconductor substrate as a reference pressure chamber.

2. Description of the Related Art

Methods for manufacturing this kind of semiconductor pressure sensors are proposed by, for example, JP-A-8-236788, JP-A-6-18345, and JP-A-11-298009. These methods are as follows.

First, a cavity (recess) is formed on a surface of a semiconductor substrate made of silicon or the like. After that, another substrate made of semiconductor or the like is bonded to the surface of the semiconductor substrate to close the cavity. Then, a heat treatment is performed to the substrates. As a result, the two substrates are securely bonded, and a reference pressure chamber is provided with a predetermined internal pressure.

Further, a diaphragm for detecting a-pressure is formed from the semiconductor substrate at a portion corresponding to the reference pressure chamber, i.e., corresponding to a bottom portion of the cavity. After that, elements such as strain gauges and an integrated circuit a reformed in the semiconductor substrate by treatments such as diffusion and implantation. As a result, a semiconductor pressure sensor is completed.

According to studies and experiments by the inventors, however, it is revealed that the conventional manufacturing method has problems as follows.

Specifically, in the conventional method, after the closed cavity, i.e., the reference pressure chamber is formed in the semiconductor substrate, the elements such as the strain gauges and the integrated circuit are formed in the semiconductor substrate. In the steps following the formation of the reference pressure chamber, the semiconductor substrate is heated for performing ion-implantation, diffusion, and the like. If temperatures of such heat treatments are too high, the internal pressure of the reference pressure chamber is increased to deform the diaphragm.

The deformation of the diaphragm is accompanied by crystal defects thereof that are produced where stress concentrates on. For example, crystal defects are liable to be produced especially at an edge portion of the diaphragm. In the portion having crystal defects, electrical leakage and mechanical leakage easily occur to hamper the element formation. Further, the diaphragm may be damaged, and pressure may leak from the reference pressure chamber.

SUMMARY OF THE INVENTION

The present invention has been made in view of the above problems. An object of the present invention is to prevent crystal defects from being produced in a diaphragm of a semiconductor pressure sensor having a reference pressure chamber in a semiconductor substrate.

According to the present invention, in a method for manufacturing a semiconductor pressure sensor, a reference pressure chamber is formed by closing a cavity formed in a semiconductor substrate, and a diaphragm is formed from a part of the semiconductor substrate corresponding to the reference pressure chamber. A first heat treatment is then performed to the semiconductor substrate, at a first temperature $T_1$ that satisfies a relation of:

$$T_1 < -430 P_0 + 1430$$

where $P_0$ is an internal pressure (atm) of the reference pressure chamber at a room temperature. Accordingly, crystal defects can be prevented from being produced in the diaphragm. The internal pressure of the reference pressure chamber can be controlled by temperature and pressure for forming the reference pressure chamber, which are determined using the Boyle-Charles's law.

The first heat treatment may be performed to form strain gauges, an insulation film, an integrated circuit or the like on the semiconductor substrate. Preferably, the reference pressure chamber is formed by performing a second heat treatment at a second temperature $T_2$ that satisfies a relation of:

$$T_2 < -430 P_0 + 1430$$

where $P_0$ is the internal pressure of the reference pressure chamber at the room temperature. Accordingly, even when the diaphragm is formed simultaneously with the reference pressure chamber, crystal defects can be prevented from being produced in the thin diaphragm securely.

BRIEF DESCRIPTION OF THE DRAWINGS

Other objects and features of the present invention will become more readily apparent from a better understanding of the preferred embodiments described below with reference to the following drawings, in which.

DETAILED DESCRIPTION OF THE PREFERRED EMBODIMENTS

First Embodiment

Figure 1:
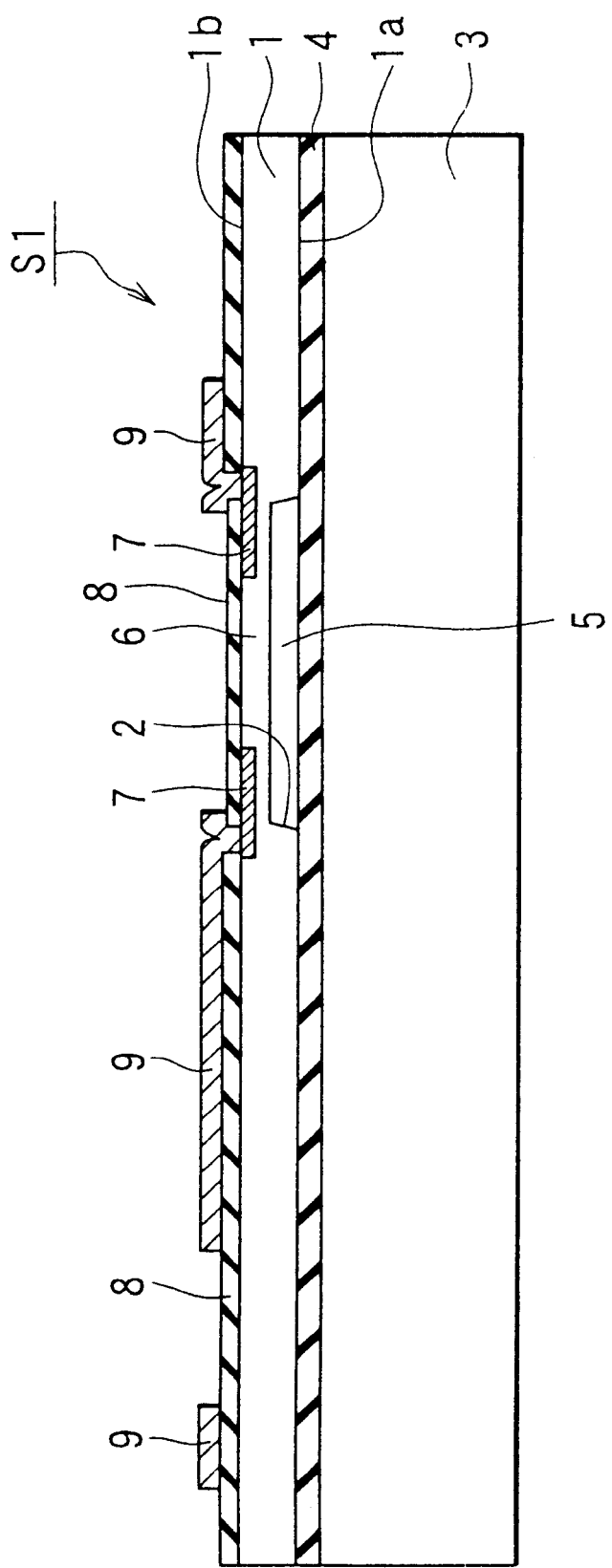
FIG. 1 is a cross-sectional view showing a semiconductor pressure sensor according to a first preferred embodiment of the present invention.

A semiconductor pressure sensor S1 according to a first preferred embodiment of the present invention is explained referring to FIG. 1.

Referring to FIG. 1, the semiconductor pressure sensor S1 has a semiconductor substrate 1 composed of an n-type single crystal silicon substrate having a (100) plane orientation. A cavity 2 is formed in the semiconductor substrate 1 as a recess from a surface 1a of the semiconductor substrate 1. Further, another substrate (base substrate) 3 made of semiconductor, glass, or the like is bonded to the surface 1a of the semiconductor substrate 1 with a silicon oxide film 4 interposed therebetween, and closes the cavity 2. In this embodiment, the substrate 3 is a single crystal silicon substrate similarly to the semiconductor substrate 1.

The cavity 2 defines a closed space by the bonding of the substrate 3, and the space works as a reference pressure chamber 5 having a predetermined internal pressure. A diaphragm 6 for detecting a pressure is formed as a thin part of the semiconductor substrate 1 corresponding to the reference pressure chamber 5, at the bottom side of the cavity 2.

The thickness of the diaphragm 6 is not limited to a specific magnitude, but is applicable in a range from a thin thickness (for example, about several $\mu$m) at which the flexure theory can be adopted (where a relation between a pressure applied to the diaphragm and a maximum flexure of the diaphragm is nonlinear), to a relatively large thickness.

For example, when the diaphragm 6 has a rectangular shape of 150 $\mu$m×150 $\mu$m and the depth of the cavity 2 is 2.5$\mu$m, the internal pressure of the reference pressure chamber 5 can be controlled to be about 0.6 atm or less at a room temperature.

Further, strain gauges 7 are formed on a surface 1b of the semiconductor substrate 1 opposed to the surface 1a, where the diaphragm 6 is formed. The strain gauges 7 constitute a bridge circuit to output an electrical signal corresponding to stress that is produced when the diaphragm 6 is strained. The strain gauges 7 are formed from a $p^+$ layer in this embodiment.

The surface 1b of the semiconductor substrate 1 is then covered with an insulation film (such as an oxide film) 8, and electrodes 9 are formed on the insulation film 8 to be electrically connected to the strain gauges 7 through contact holes formed in the insulation film 8. The electrodes 9 include a wiring member for externally outputting the electrical signal from the strain gauges 7 and pads for wire bonding.

The above-described semiconductor pressure sensor S1 is an absolute-pressure sensor having the reference pressure chamber 5, and outputs the electrical signal from the strain gauges 7 in accordance with the strain produced when the diaphragm 6 is deformed upon receiving a pressure at a side of the surface 1b of the semiconductor substrate 1. The signal from the strain gauges 7 is outputted, through the electrodes 9 as the wiring member and the pads, to a signal processing circuit or the like that is provided-at an outside. Thus, the pressure is detected.

Next, a method for manufacturing the semiconductor pressure sensor S1 is explained referring to FIGS. 2A to 2F.

Figure 2A:
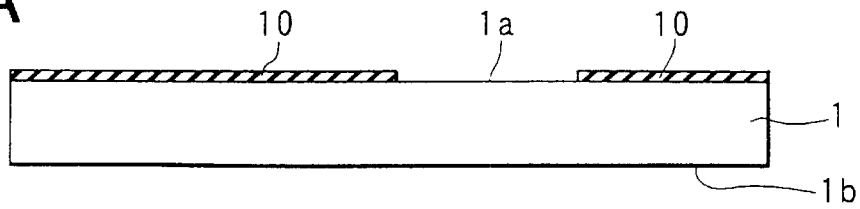
FIGS. 2A to 2F are cross-sectional views showing a method for manufacturing the semiconductor pressure sensor shown in FIG. 1 in a stepwise manner.

First, as shown in FIG. 2A, the semiconductor substrate (n-type (100) single crystal silicon substrate in this embodiment) 1 is prepared, and an oxide film (silicon oxide film) 10 is deposited on the surface 1a of the semiconductor substrate 1 by thermal oxidation. After that, the oxide film 10 is patterned to be open at a region where the cavity 2 is to be formed (oxide film formation step).

Figure 2B:
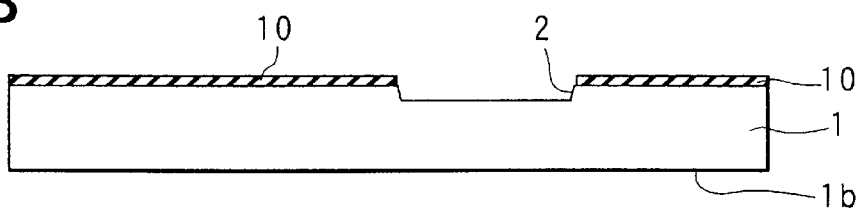
Figure 2C:
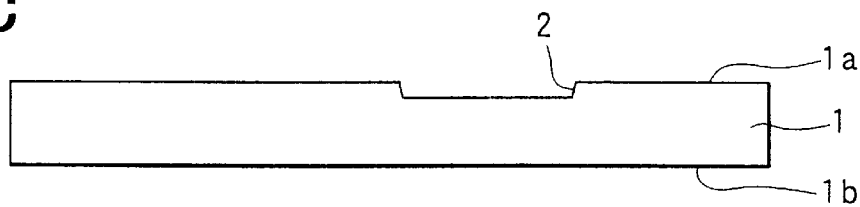

Then, as shown in FIG. 2B, anisotropic etching is performed using the oxide film 10 as a mask and using a solution of KOH (potassium hydroxide), TMAH (tetramethyl ammonium hydroxide), or the like. Accordingly, the cavity 2 is formed on the surface 1a of the semiconductor substrate 1 (cavity formation step). As shown in FIG. 2C, the oxide film 10 is removed from the surface 1a of the semiconductor substrate 1. Specifically, wet etching is performed using a solution of HF:$H_2O$=1:10 (oxide film removal step).

Figure 2D:
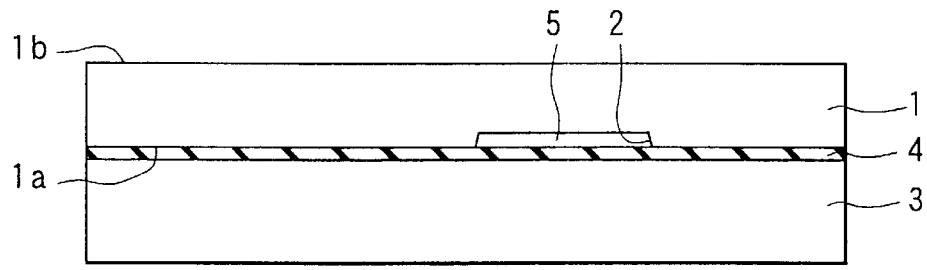

Next, as shown in FIG. 2D, another substrate (single crystal silicon substrate in this embodiment) 3 having the oxide film (silicon oxide film) 4, formed on a surface thereof by thermal oxidation, is prepared, and the substrate 3 is bonded to the surface 1a of the semiconductor 1a through the oxide film 4. Then, a heat treatment is performed at, for example, in a range of 1100° C. to 1150° C. to enhance the bonding strength of the two substrates 1, 3. As a result, the two substrates 1, 3 are bonded together through the oxide film 4 in a convalent bond, and the reference pressure chamber 5 is defined (reference pressure chamber formation step).

At that time, the ambient pressure when the two substrates 1, 3 are bonded is determined based on the Boyle-Charles's law so that the reference pressure chamber 5 has a desired internal pressure at a room temperature. For example, when the diaphragm has a rectangular shape of 150 $\mu$m×150 $\mu$m, the depth of the cavity 2 is 2.5 $\mu$m, and the internal pressure of the reference pressure chamber 5 is about 0.6 atm at a room temperature, the ambient pressure at the bonding is controlled to be about $10^{-6}$ Torr ($133 \times 10^{-6}$Pa). Here, the Boyle-Charles's law is represented by a formula of PV=nRT, where P is a pressure, V is a volume, n is a molar number, R is gas constant, and T is a temperature.

In this and following steps, crystal defects are liable to be produced especially at the corner portions of the cavity 2 (reference pressure chamber 5), i.e., at the edge portions of the diaphragm 6 formed in the next step. Therefore, the internal pressure of the reference pressure chamber 5 should be controlled so that stress (maximum stress) applied to the edge portions of the diaphragm 6 does not exceed a breaking stress (strength) of silicon.

Stress applied to the edge portions of the diaphragm 6 varies with changes of the thickness and the area of the diaphragm 6. For example, when the thickness of the diaphragm is 2.5 $\mu$m, and the area of the diaphragm is 150 $\mu$m×150 $\mu$m, the internal pressure of the reference pressure chamber 5 is preferably controlled to be 3.2 atm or less at the room temperature. Therefore, the heat treatment temperature in the reference pressure chamber formation step is controlled so that the reference pressure chamber 5 has an internal pressure of 3.2 atm or less (for example, 0.6 atm) at the room temperature.

Figure 2E:
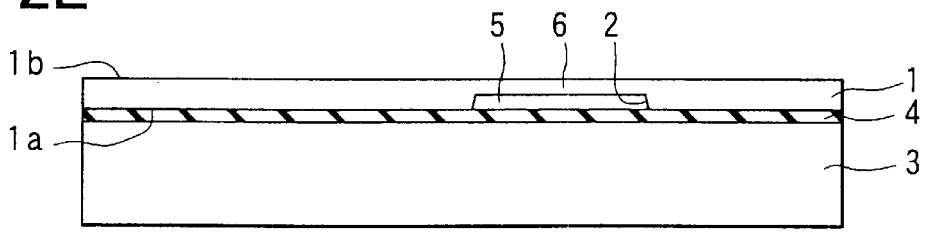
Figure 2F:
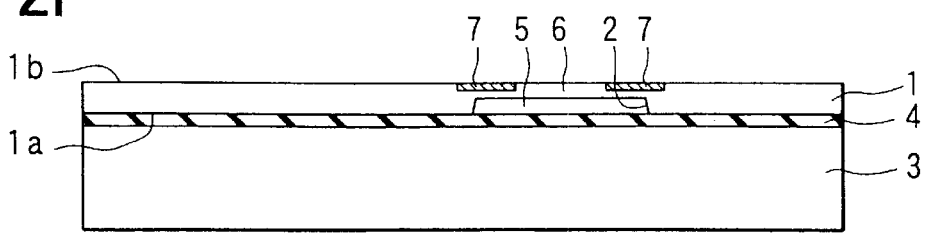

Then, as shown in FIG. 2E, the semiconductor substrate 1 is thinned from the side of the surface 1b to form the diaphragm 6 (diaphragm formation step). This thinning step can be performed by grinding and polishing or by wet etching of silicon. After that, as shown in FIG. 2F, the strain gauges 7 are formed on the surface 1b of the semiconductor substrate 1 by forming a $p^+$ layer in which boron is diffused.

Successively, the insulation film 8 is formed by thermal oxidation, and the electrodes 9 are formed by deposition or sputtering of aluminum. Thus, the strain gauges 7, the insulation film 8, the electrodes 9, and, if necessary, elements such as an integrated circuit are formed on the semiconductor substrate 1, so that the semiconductor pressure sensor S1 shown in FIG. 1 is completed.

According to the manufacturing method as described above, in the reference pressure chamber formation step for forming the reference pressure chamber 5 and in the element formation step performed after the reference pressure chamber 5 is formed, heat treatments are performed with respect to the semiconductor substrate 1. For example, temperature (heat treatment temperature) $T_1$ of the heat treatment that is performed to the semiconductor substrate 1 after the reference pressure chamber 5 is formed (for example, for thermal oxidation or impurity diffusion) is 1150° C., and temperature $T_2$ of the heat treatment that is performed when the reference pressure chamber 5 is formed is in a range of about 1100° C. to 1150° C.

Here, in the first embodiment, in order to prevent crystal defects in the diaphragm 6, the heat treatment temperatures $T_1$, $T_2$ are controlled to be lower than $(-430P_0+1430)°$ C. where $P_0$ (atm) is the internal pressure of the reference pressure chamber 5 at the room temperature. The reason why this relation is adopted is as follows.

Specifically, the following experiments were performed to prevent occurrence of crystal detects in the diaphragm 6. First, in the semiconductor pressure sensor S1, the above-described steps were performed to the diaphragm formation step, and several sensor samples (sub-works) were manufactured to have various internal pressures (atm) of the reference pressure chamber 5 at the room temperature (25° C.). Then, after the respective sub-works were exposed to various heat treatment temperatures, they were examined by using SEM, TEM, and the like to check the occurrence of crystal defects in the diaphragm 6.

Here, crystal defects are mainly dislocations induced in a crystal lattice structure (lattice structure of single crystal silicon) of the semiconductor substrate 1. When the heat treatment temperature is so high that the internal pressure of the reference pressure chamber 5 becomes too large, stress of the diaphragm 6 exceeds a yield stress so that the diaphragm 6 is plastically deformed to have dislocations therein.

Figure 3:
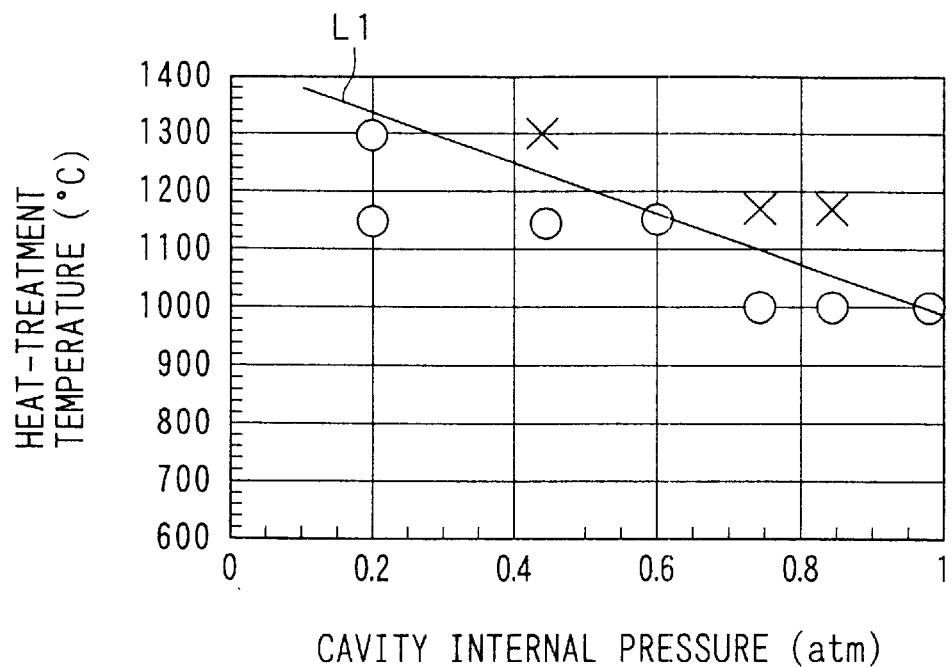
FIG. 3 is a graph showing existence of crystal defects produced in a diaphragm at various heat treatment temperatures and various internal pressures of a cavity.

FIG. 3 shows existence of crystal defects at various internal pressures of the reference pressure chamber (cavity internal pressure) at the room temperature and various heat treatment temperatures. In FIG. 3, a horizontal axis indicates cavity internal pressures (atm) and a vertical axis indicates heat treatment temperatures (° C.). Mark O represents a case where no crystal defect exists, while mark X represents a case where crystal defects exist.

As indicated with a straight line L1 in FIG. 3, a boundary that divides whether crystal defects are produced or not is linear in the relation between the cavity internal pressure and the heat treatment temperature. That is, crystal defects are produced in the upper region of the straight line L1 as the boundary, and are not produced in the lower region of the straight line L1.

The heat treatment temperature in FIG. 3 corresponds to the temperature of the heat treatment that is performed to the semiconductor substrate 1 after the reference pressure chamber 5 is formed. Therefore, the straight line L1 is represented by formula (1).

$$T_1 = -430P_0 + 1430 \qquad (1)$$

where $T_1$ is the temperature of the heat treatment performed to the semiconductor substrate 1 after the reference pressure cavity 5 is formed, and $P_0$ is the internal pressure (atm) of the reference pressure chamber 5. Further, as understood from FIG. 3, the heat treatment temperature $T_1$ and the internal pressure $P_0$ should be in the lower region of the straight line L1 in order to prevent occurrence of crystal defects in the diaphragm 6.

That is, the heat treatment temperature $T_1$ should be lower than $(-430P_0+1430)°$ C. when the heat treatment is performed to the semiconductor substrate 1 to form the elements such as the strain gauges 7 and the integrated circuit or to do other things after the reference pressure cavity 5 is formed.

The results shown in FIG. 3 apply to the temperature $T_2$ of the heat treatment that is performed to the semiconductor substrate when the reference pressure chamber 5 is formed (in the reference pressure chamber formation step). That is, when the heat treatment temperature $T_2$ is lower than $(-430P_0+1430)°$ C., the bottom surface portion of the cavity 2 that is to from the diaphragm 6 can be prevented from being deformed to have crystal defects therein in the reference pressure chamber formation step. In consequence, crystal defects can be prevented from being produced in the diaphragm 6.

In the above-described manufacturing method, because the bottom surface portion of the cavity formed in the reference pressure chamber formation step is a portion for forming the diaphragm 6, the bottom surface portion is thicker than the final thickness of the diaphragm 6. Therefore, the bottom surface portion is less liable to be deformed at the heat treatment temperature $T_2$ and less liable to have crystal defects therein in the reference pressure chamber formation step.

In this connection, even when only the heat treatment temperature $T_1$ is lower than $(-430P_0+1430)°$ C. and the heat treatment temperature $T_2$ is $(-430P_0+1430)°$ C. or more, the occurrence of crystal defects can restricted effectively. However, when both the heat treatment temperatures $T_1$, $T_2$ are set to be lower than $(-430P_0+1430)°$ C., the occurrence of crystal defects can be restricted more effectively (at a higher level).

In the above-described manufacturing method, the diaphragm 6 may be formed at the cavity formation step without performing the diaphragm formation step. For example, anisotropic etching or dry etching may be performed to form the cavity until the diaphragm 6 is formed with a final desired thickness. In this case, the reference pressure chamber formation step is performed to the semiconductor substrate 1 having the thin diaphragm 6. When the bottom surface portion of the cavity 2 is composed of the thin diaphragm 6, the diaphragm 6 becomes liable to be plastically deformed easily to have crystal defects therein at the heat treatment temperature $T_2$ when the substrates 1, 3 are bonded to form the reference pressure chamber 5.

Therefore, especially in this case, not only the heat treatment temperature $T_1$ after the reference pressure chamber 5 is formed but also the heat treatment temperature $T_2$ when the reference pressure chamber 5 is formed should be controlled to be lower than $(-430P_0+1430)$ because the heat treatment temperature $T_2$ largely affects the occurrence of crystal defects.

Second Embodiment

In the $47^{th}$ Applied Physics Association Lecture held from Mar. 28, 2000 to Mar. 31, 2000, Sato et al. of Toshiba Inc. reported "A new substrate engineering using silicon surface migration" (Preliminary Report No. 2, p. 888–889). It teaches that a cavity can be formed in a semiconductor substrate by forming a trench having a large aspect ratio on the substrate in advance and by performing a heat treatment in a reduction atmosphere of hydrogen or the like to cause surface migration of silicon.

Figure 4:
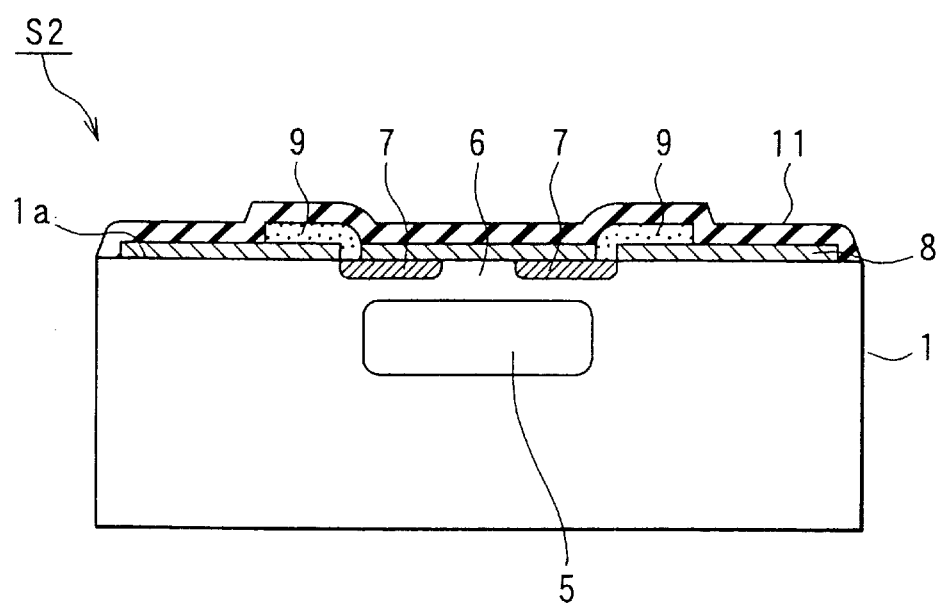
FIG. 4 is a cross-sectional view showing a semiconductor pressure sensor according to a second preferred embodiment of the present invention.

A semiconductor pressure sensor S2 in a second preferred embodiment shown in FIG. 4 is formed with a reference pressure chamber by utilizing the surface migration of silicon. In FIG. 4, the same or similar parts as those shown in FIG. 1 are designated with the same reference numerals.

Specifically, in the sensor S2, a reference pressure chamber 5 is formed inside a semiconductor substrate 1 as a closed space, and a diaphragm 6 is formed as a thin portion at a side of the surface 1a of the semiconductor substrate 1 corresponding to the reference pressure chamber 5.

Similarly to the sensor S1 shown in FIG. 1, strain gauges 7 composed of a p+ layer, and an insulation film (oxide film) 8 are formed on the semiconductor substrate 1, and electrodes 9 made of aluminum or the like are formed to be electrically connected to the strain gauges 7 through contact holes formed in the insulation film 8. Elements such as an integrated circuit are optionally formed, and the surface of the sensor S2 is covered with a protective film 11 made of silicon nitride (SiN) or the like. Thus, the sensor S2 is so constructed that it works as an absolute-pressure sensor, and can detect pressure similarly to the sensor S1.

Figure 5A:
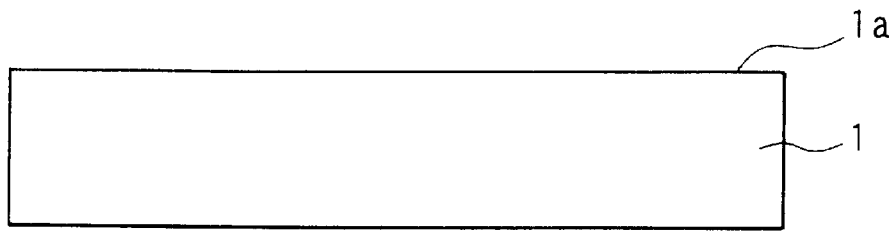
FIGS. 5A to 5D are cross-sectional views showing a method for manufacturing the semiconductor pressure sensor shown in FIG. 4 in a stepwise-manner.
Figure 5B:
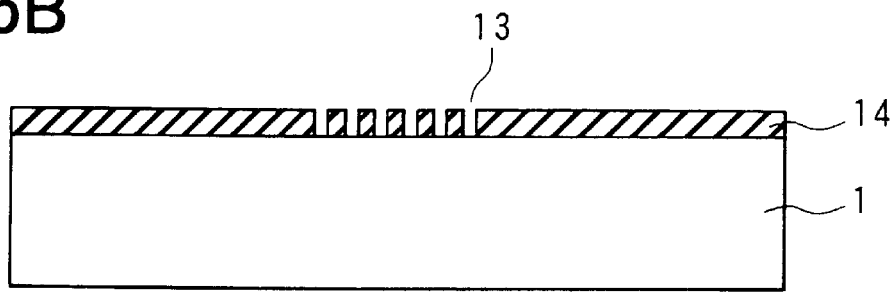

The sensor S2 can be manufactured by a manufacturing method as shown in FIGS. 5A to 5D. For example, the semiconductor substrate 1 made of silicon is prepared in FIG. 5A. In FIG. 5B, the surface 1a of the semiconductor substrate 1 is covered with mask 14 made of a silicon oxide film having openings 13 open where several trenches 12 are to be formed.

Figure 5C:
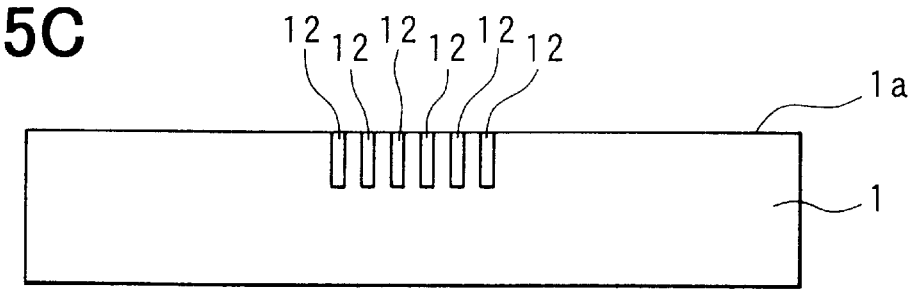

Next, after the trenches 12 each having a large aspect ratio are formed as cavities on the surface 1a of the semiconductor substrate 1 by a trench etching method (cavity formation step), as shown in FIG. 5C, the mask 14 is removed by wet-etching using hydrogen fluoride (HF) or dry etching. Then, a heat treatment is performed to the semiconductor substrate 1 having the trenches 12, in reduction atmosphere including hydrogen or the like, at a temperature of, for example, about 1100° C. to 1150° C.

Figure 5D:
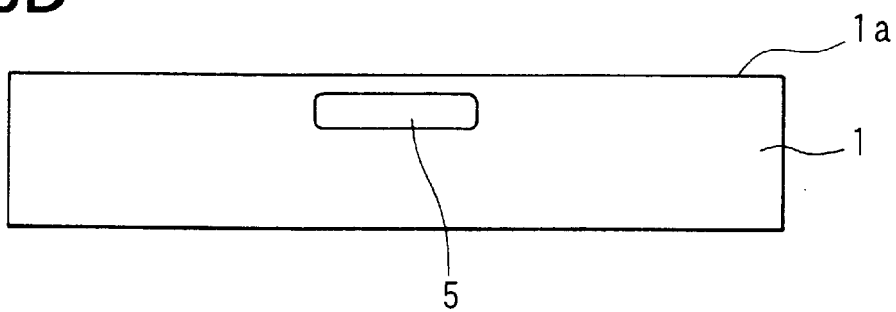

As a result, the several trenches 12 are integrated to form a space as a whole inside the semiconductor substrate 1 and simultaneously the opening portions of the trenches 12 are closed (blocked) on the surface 1a of the semiconductor substrate 1, due to surface migration of silicon. The space formed inside the semiconductor substrate 1 works as the reference pressure chamber 5, and the blocked portion forms the diaphragm 6 at the side of the surface 1a of the semiconductor substrate 1 (reference chamber formation step). The state at this point is shown in FIG. 5D. After that, the strain gauges, the insulation film, the electrodes, and the elements are formed on the semiconductor substrate 1 (element formation step). Thus, the semiconductor pressure sensor S2 shown in FIG. 4 is completed.

Also in the manufacturing method according to the second embodiment, crystal defects can be prevented from being produced in the diaphragm 6 by setting the temperature $T_1$ of the heat treatment, which is performed to the semiconductor substrate 1 after the reference pressure chamber 5 is formed, to be lower than $(-430P_0+1430)°$ C.

For example, in the case where the strain gauges 7 are formed from a $p^{30}$ layer in which boron is diffused, after boron is implanted, a heat treatment is performed at about 1050° C. to diffuse the boron. Further, in the case where the insulation film 8 is formed from a silicon oxide film ($SiO_2$), the insulation film 8 is formed by the heat treatment of about 1050° C. In the case where the electrodes 9 are made of aluminum, it is deposited at several hundreds degrees. Moreover, in the case where the protective film 11 is made of SiN deposited by plasma CVD, a temperature of about 200° C. is applied during the formation of SiN.

In the present embodiment, the thin diaphragm is formed in the reference pressure chamber formation step. Therefore, in order to prevent crystal defects from being produced in the diaphragm 6 sufficiently, not only the heat treatment temperature $T_1$ but also the heat treatment temperature $T_2$, which is performed when the reference pressure chamber 5 is formed should be controlled to be lower than $(-430P_0+1430)°$ C. (for example, about 1100° C. to 1150° C.).

Incidentally, in the reference pressure chamber formation step of the present embodiment, the heat treatment is performed to the semiconductor substrate 1 that is placed in a sealed vessel (not shown) having reduction atmosphere such as hydrogen atmosphere. At that time, the pressure inside the sealed vessel is determined by controlling a flow rate of reduction gas flowing in the vessel and the like so that the internal pressure $P_0$ of the reference pressure chamber 5 finally has a desired value at the room temperature.

While the present invention has been shown and described with reference to the foregoing preferred embodiments, it will be apparent to those skilled in the art that changes in form and detail may be made therein without departing from the scope of the invention as defined in the appended claims.

For example, in the semiconductor pressure sensor S1 shown in FIG. 1, the substrate 3 is not limited to a semiconductor substrate, but may be a glass substrate (glass base) or the like. In this case, the semiconductor substrate 1 and the substrate 3 are bonded together by anodic bonding at the heat treatment temperature $T_2$ as described above.

Although each the semiconductor pressure sensors S1, S2 is an absolute-pressure sensor having the reference pressure chamber 5, the present invention is not limited to that. The present invention may be applied to relative pressure sensors as disclosed in JP-A-8-236788.

In this case, for example, in the sensor S1 shown in FIG. 1, a hole (pressure conduction hole) is formed in the substrate 3 so that it allows communication between outside and inside of the reference pressure chamber 5, and the diaphragm 6 receives the pressure introduced from the hole and the pressure applied to the surface 1a of the semiconductor substrate 1 to detected a relative pressure therebetween.

What is claimed is:

1. A method for manufacturing a semiconductor pressure sensor, comprising:

forming a cavity on a semiconductor substrate;

closing the cavity to form a reference pressure chamber;

forming a diaphragm from a part of the semiconductor substrate corresponding to the reference pressure chamber;

performing a first heat treatment to the semiconductor substrate after the reference pressure chamber is formed, at a first temperature $T_1$ that satisfies a relation of:

$T_1 < (-430P_0+1430)°$ C.

where $P_0$ is an internal pressure (atm) of the reference pressure chamber at a room temperature.

2. The method according to claim 1, wherein the first heat treatment is performed to form an element on the semiconductor substrate.

3. The method according to claim 1, wherein the first heat treatment is performed to form a film on the semiconductor substrate.

4. The method according to claim 1, wherein the reference pressure chamber is formed by performing a second heat treatment at a second temperature $T_2$ that satisfies a relation of:

$T_2 < (-430P_0 + 1430)° C.$ where $P_0$ is an internal pressure of the reference pressure chamber at a room temperature.

5. The method according to claim 1, wherein:
the cavity is closed by bonding a base substrate to the semiconductor substrate; and
the diaphragm is formed by thinning the semiconductor substrate at an opposite side of the cavity.

6. The method according to claim 1, wherein:
the cavity is composed of a plurality of trenches; and opening portions of the plurality of trenches are closed and the plurality of trenches are integrated inside the semiconductor substrate by performing a second heat treatment to form the reference pressure chamber and to form the diaphragm.

7. The method.according to claim 1, wherein the first temperature is controlled so that a stress applied to an edge portion of the diaphragm at an inside of the reference pressure chamber is smaller than a breaking stress of a material forming the semiconductor substrate.

* * * * *